(12) United States Patent
Jeter et al.

(10) Patent No.: US 9,672,882 B1
(45) Date of Patent: Jun. 6, 2017

(54) CONDITIONAL REFERENCE VOLTAGE CALIBRATION OF A MEMORY SYSTEM IN DATA TRANSMISSON

(71) Applicant: Apple Inc., Cupertino, CA (US)

(72) Inventors: Robert E. Jeter, Santa Clara, CA (US); Rakesh L. Notani, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/083,909

(22) Filed: Mar. 29, 2016

(51) Int. Cl.
*G11C 7/22* (2006.01)
*G11C 29/04* (2006.01)

(52) U.S. Cl.
CPC ...................................... *G11C 7/22* (2013.01)

(58) Field of Classification Search
CPC . G11C 7/22; G11C 7/1009; G11C 2207/2254; G11C 7/1093; G11C 11/4096; G11C 7/1078; G11C 7/10; G11C 29/023; G11C 29/028; G11C 29/022; G11C 29/02; H03L 7/08; H01L 31/085; G06F 1/08; G06F 13/1689; G06F 1/12
USPC .............. 365/189.07, 191, 193, 194, 233.19, 365/233.13, 233.14
See application file for complete search history.

(56) References Cited

U.S. PATENT DOCUMENTS

| | | | |
|---|---|---|---|
| 6,960,952 B2 | 11/2005 | Nguyen | |
| 7,872,494 B2 | 1/2011 | Welker | |
| 8,897,084 B2 * | 11/2014 | Chen | .................... G06F 13/1689 365/191 |
| 8,923,442 B2 | 12/2014 | Chandrasekaran | |
| 9,202,961 B2 * | 12/2015 | Chen | ..................... H01L 31/085 |
| 9,286,961 B1 * | 3/2016 | Jeter | ......................... H03L 7/08 |
| 9,305,622 B1 * | 4/2016 | Jeter | ......................... G11C 7/22 |
| 9,396,778 B1 * | 7/2016 | Jeter | ......................... G11C 7/22 |
| 9,436,387 B2 * | 9/2016 | Jeter | ..................... G06F 3/0604 |
| 2016/0035411 A1 | 2/2016 | Yu | |
| 2016/0209866 A1 * | 7/2016 | Jeter | ......................... G06F 1/08 |

* cited by examiner

*Primary Examiner* — Hien Nguyen
(74) *Attorney, Agent, or Firm* — Meyertons, Hood, Kivlin, Kowert & Goetzel, P.C.; Erik A. Heter (57) ABSTRACT

A method and apparatus for memory subsystem calibration in which periodic calibrations of a data strobe delay and reference voltage are scheduled. After a first calibration, a reference score is determined based on a parameter of an eye opening. On a next scheduled calibration thereafter, the data strobe delay is calibrated at the most recent value of the reference voltage. A score is then determined, and compared to the reference score. If the score is within a specified range of the reference score, then no calibration of the reference voltage is performed on the current cycle. Otherwise, the reference voltage is calibrated as well.

20 Claims, 5 Drawing Sheets

CONDITIONAL REFERENCE VOLTAGE CALIBRATION OF A MEMORY SYSTEM IN DATA TRANSMISSON

BACKGROUND

Technical Field

This disclosure is directed to memory subsystems, and more particularly, calibration of signals conveyed in memory subsystems.

Description of the Related Art

Eye diagrams, are graphic illustrations that illustrate times and amplitudes at which a digital signal can be sampled at its correct value. In various types of systems that include data transmissions, sampling of signals (based on a clock signal) near a center of an eye, in terms of time, may be desirable. This may provide a signal with a sufficient amount of both setup and hold time, while also rendering it less susceptible to noise. In sampling a signal, a threshold voltage is used to determine whether the signal is interpreted as a logic 0 or a logic 1.

In memory systems, calibrations may be performed to determine the points at which signals are sampled within the eye opening. Calibrations may be performed to determine both the point in time at which signals are sampled, as well as to determine the threshold voltage for distinguishing between logic 0's and logic 1's. The calibration to determine the point in time at which signals are sampled may be referred to as a horizontal calibration. The calibration to determine the threshold voltage may be referred as a vertical calibration. In many memory systems, these calibrations are performed at regular intervals, and typically, in conjunction with one another.

SUMMARY

A method and apparatus for memory subsystem calibration is disclosed. In one embodiment, periodic calibrations of a data strobe delay and reference voltage are scheduled. After a first calibration, a reference score is determined based on a parameter of a eye opening. On a next scheduled calibration thereafter, the data strobe delay is calibrated at the most recent value of the reference voltage. A score is then determined, and compared to the reference score. If the score is within a specified range of the reference score, then no calibration of the reference voltage is performed on the current cycle. Otherwise, the reference voltage is calibrated as well. Furthermore, the reference score is updated subsequent to calibrating the reference voltage.

The calibration of the data strobe delay may be accomplished by conducting a number of writes to and reads from memory, comparing the written data to the data that is read. Different values of the delay may be applied to the data strobe signal during the reads and writes. Similarly, the calibration of the reference voltage may also include a number of writes to and reads from memory, along with the comparisons of read data to written data. Different reference voltages (i.e. the voltage used to distinguish between a logic 0 and a logic 1) are used during the reads and writes performed during the reference voltage calibration, as well as different data strobe delay values. A reference voltage calibration may be considered to be a number of different calibrations of the data strobe delay using different reference voltages.

In one embodiment, the score and the reference score may each be determined based on the width of a data eye, or eye opening. The score may be determined based on the width of an eye opening that is an average of all bits read from memory, a single selected bit (e.g., a worst-case bit), or some other combination thereof. The reference score may be determined upon an initial calibration of both the data strobe delay and reference voltage. In subsequent calibrations, a score may be determined based on calibrating the data strobe delay while conducting reads based on the most recent calibrated value of the reference voltage. The reference score may be updated when the reference voltage is calibrated. Otherwise, in iterations in which only the data strobe delay is calibrated, the reference score may remain unchanged.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. An "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. §112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Figure 1:
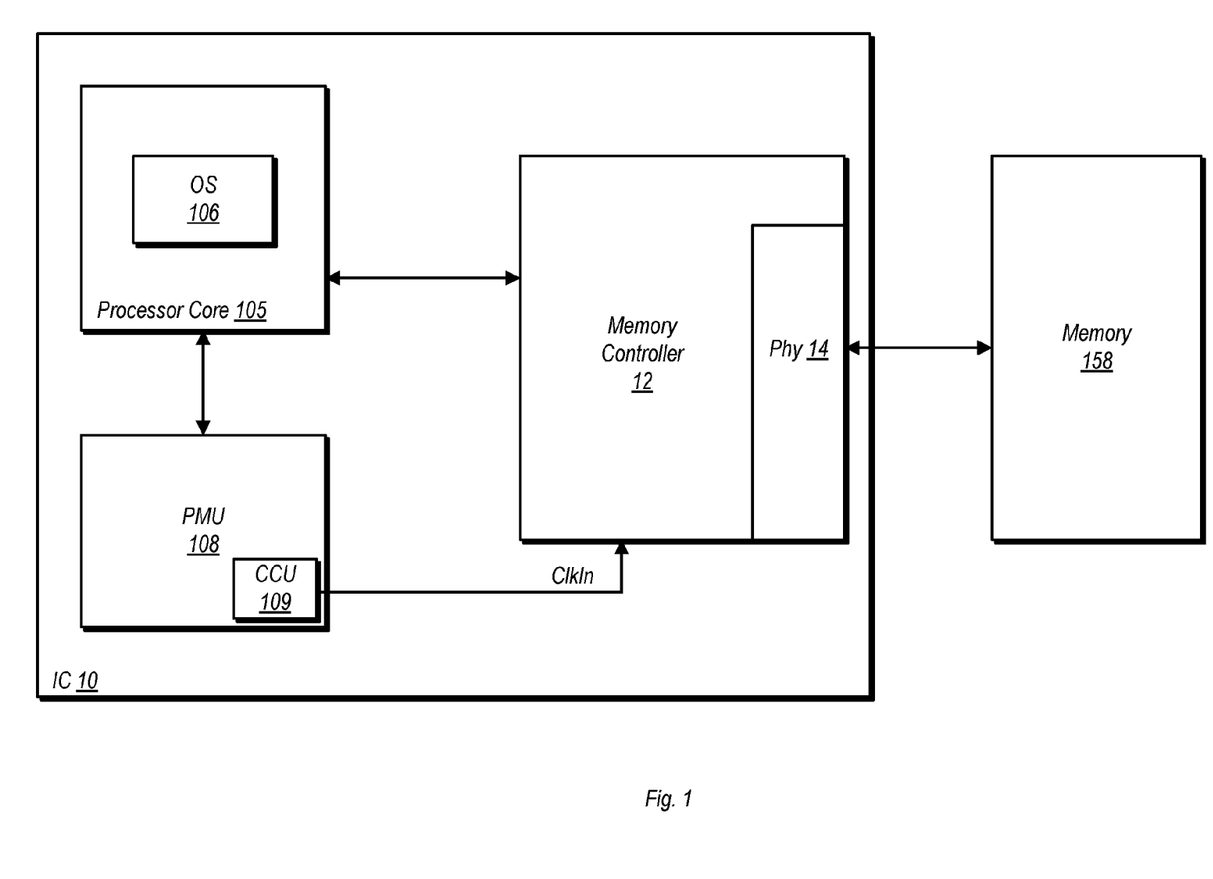
FIG. 1 is a block diagram of one embodiment of an integrated circuit and a memory coupled thereto.

FIG. 1 is a block diagram of one embodiment of an integrated circuit (IC). IC 10 is shown here as a simplified block diagram including various units/circuits implemented thereon. However, other embodiments are possible and contemplated, and may include additional circuits/units not shown here or explicitly discussed herein.

In the embodiment shown, IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same may be present. Processor core 105 is configured to execute software instructions, including those of operating system (OS) 105. The instructions of OS 105 may when executed, cause various system management functions to be performed such as memory allocation, performance state changes, and so forth.

IC 10 also includes a power management unit (PMU) 108 in the illustrated embodiment. PMU 108 may implement circuitry that performs various power control functions, such as supply voltage changes, power gating, clock frequency changes, and clock gating. These power control functions may be performed in conjunction with performance state changes. Such performance state changes may be put into effect via execution of instructions of OS 105 or through other mechanisms within PMU 108 itself.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by other clock generation circuitry external thereto.

Memory controller 12, which includes physical interface (PHY) 14, provides an interface between processor core 105 and memory 158. Although not explicitly shown, IC 10 may also include one or more units of interface circuitry that are also coupled to memory controller 12. Accordingly, memory controller 12 may provide an interface for one or more circuits external to IC 10 and memory 158.

Figure 2:
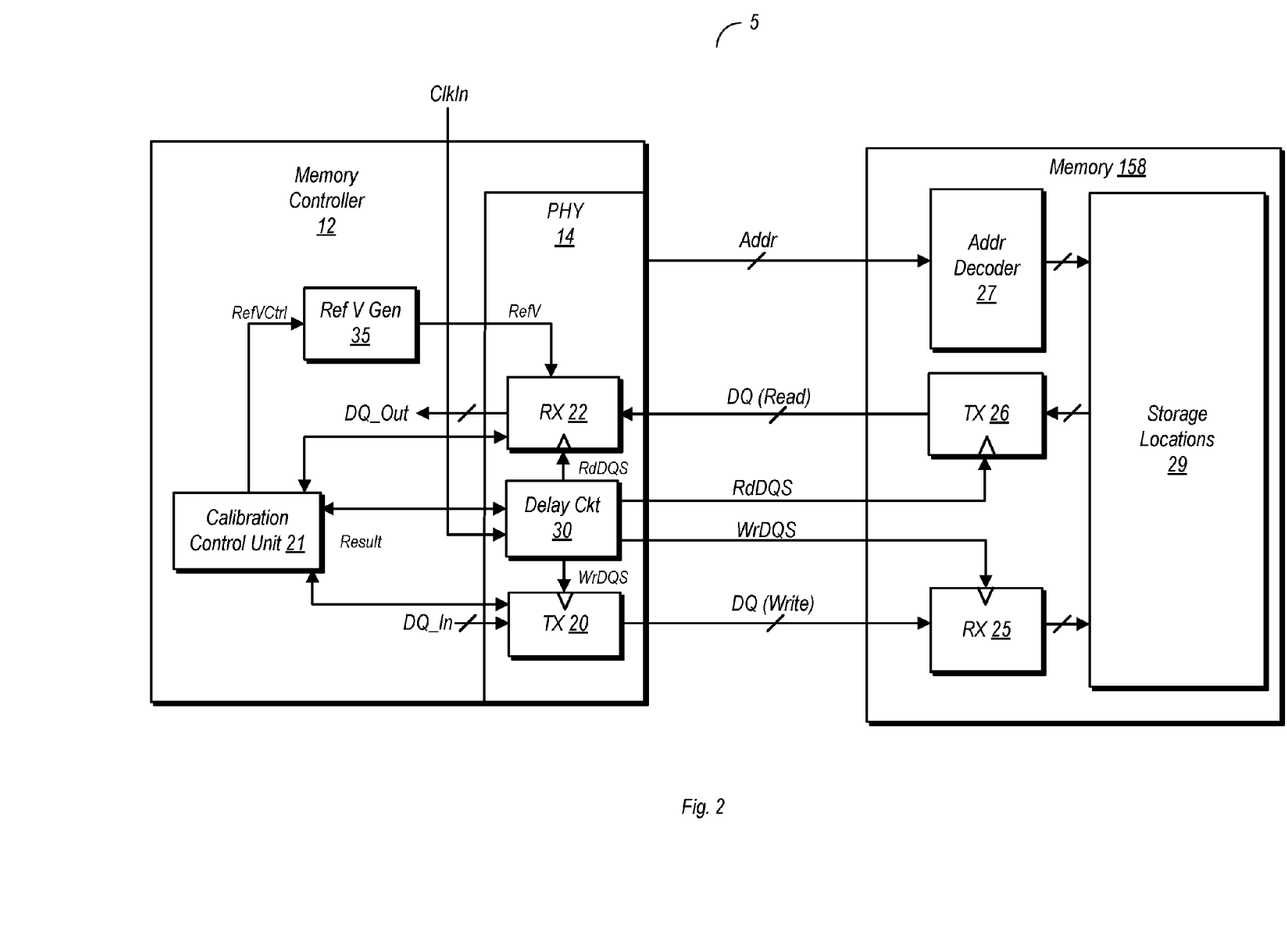
FIG. 2 is a block diagram of one embodiment of a memory subsystem.

Turning now to FIG. 2, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data read from memory 158, and a transmitter 20 configured to transmit data to memory 158. Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes a calibration control unit 21, which may conduct various calibrations in the memory subsystem, as will be discussed below.

Physical layer 14 includes a delay circuit 30 that is coupled to receive an input clock signal ('Clk'). In the embodiment shown, delay circuit 30 may include two separate paths to apply delays to the input clock signal to generate a read data strobe ('RdDQS') and a write data strobe ('WrDQS'). For example, one embodiment of delay circuit 30 may include a pair of delay locked loops (DLLs), one configured to output the read data strobe and one to output the write data strobe. The delays of the respective DLL's may be set according to control signals generated elsewhere in memory controller 12, e.g., in calibration control unit. Types of delay circuits other than DLL's are also possible and contemplated for various other embodiments.

Delay circuit 30 may provide the read data strobe to receiver 22 in physical layer 14, as well as to transmitter 26 in memory 158. The read data strobe signal may be used in synchronizing reads of memory 158. The write data strobe may be provided to transmitter 20 of physical layer 14, along with receiver 25 of memory 158. Accordingly, the write data strobe may be used in synchronizing writes to memory 158.

Memory 158 in the embodiment shown includes an address decoder 27 coupled to receive an address from physical layer 14 of memory controller 12. Address decoder 27 may decode the received address to enable particular ones of the storage locations 29 that are to be enabled for a current memory operation. Addresses may be provided from physical layer 14 of memory controller 12 for both read operation and write operations.

The data strobe signals provided by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram. Accordingly, calibration procedures may be performed at certain times during operation of memory controller 12 in order to optimize the point in time at which the data strobe signals sample data and involve performing a number of reads of from memory along with adjustments of an amount of delay applied to the data strobe signal being calibrated. The calibration of the data strobe delay may be performed periodically, and may sometimes be referred to as a horizontal calibration.

A reference voltage calibration may also be performed under the control of calibration control unit 21. The reference voltage may be that voltage that is used to distinguish between a logic 0 and a logic 1. Over time, due to process, voltage, and temperature variations, the reference voltage may need to be calibrated. This calibration may also be performed periodically, and may sometimes be referred to as a vertical calibration. Based on the calibration, calibration control unit may set the reference voltage at reference voltage generator 35 using the signal RefVCtrl. The reference voltage, RefV, or an indication of the same, may be provided from reference voltage generator 35 to receiver 22.

The calibration procedures may be conducted under the control of calibration control unit 21. A calibration includes performing multiple iterations of writing data to memory, reading the data back from memory, and comparing the read data to the written data. Writes and reads of data for calibrating the data strobe delay may include a performing writes and reads at number of different delay values. Writes and reads for calibrating the reference voltage may include performing a number of different writes and reads at different reference voltage values.

Upon performing a calibration, calibration control unit 21 may determine the parameters of an eye opening based on the calibrated values of the data strobe delay and the reference voltage. As the data bus (DQ) has a number of bit positions from which data is received and read, the parameters of an eye opening may be determined for each. Accordingly, calibration control unit 21 includes functionality (e.g., circuitry) for determining an eye opening for each bit position during each iteration of a performed calibration. Information obtained from the eye openings for each bit may be used in subsequent calibrations, as discussed in further detail below.

In one embodiment, the horizontal and vertical calibrations may be performed at the same periodic intervals, with one being performed on an interval just after completing the other. The vertical calibration may require a significantly greater amount of time to complete than the horizontal calibration, as the vertical calibration includes a number of different horizontal calibrations performed at different reference voltages. The greater amount of time required to perform the vertical calibration can reduce the overall system performance, since the memory is not available for normal transactions during this time. Furthermore, if performance state changes occur in conjunction with a vertical calibration, operation in the new performance state may be delayed. Accordingly, calibration control unit 21 may be configured to conditionally inhibit performance of the vertical calibration. In one embodiment, a reference score may be computed based on parameters of one or more of the eye openings determined during a previous calibration. During a current iteration of a calibration, the horizontal calibration may be performed first, using the previously calibrated value of the reference voltage. A score may be determined based an eye opening from the current iteration of the horizontal calibration. This score may then be compared to the reference score that was determined previously when both the data strobe delay and reference voltage were calibrated. If the score is within a specified range of the reference score, the vertical calibration may be inhibited. In one exemplary embodiment, if the score is within a range of ±5% of the reference score, the vertical calibration is not performed in the current iteration. Instead, the results of the horizontal calibration are applied (e.g., setting delay elements to provide delay to the data strobe per the horizontal calibration performed in the current iteration). Otherwise, if the score is not within the specified range, the vertical calibration is performed on the current iteration. On iterations in which the vertical calibration is performed, the reference score may be updated accordingly and used as a basis for comparison in future iterations of the calibration procedure.

Conditional performing (or inhibiting) the vertical calibration may save a significant amount of calibration time. This may be useful when variation in the eye openings from one iteration to the next is small, if not negligible. Eliminating a significant number of vertical calibration iterations may increase the availability of the memory subsystem. This in turn may increase the performance per watt of the memory subsystem, as more time may be spent performing memory operations that are related to normal system operation rather than explicitly tied to calibration operations. However, the vertical calibration may be performed when indicated as warranted based on specified conditions. Accordingly, a balance may be achieved between keeping the reference voltage at a calibrated value while increasing the amount of time that the memory is available for normal operations.

Figure 3:
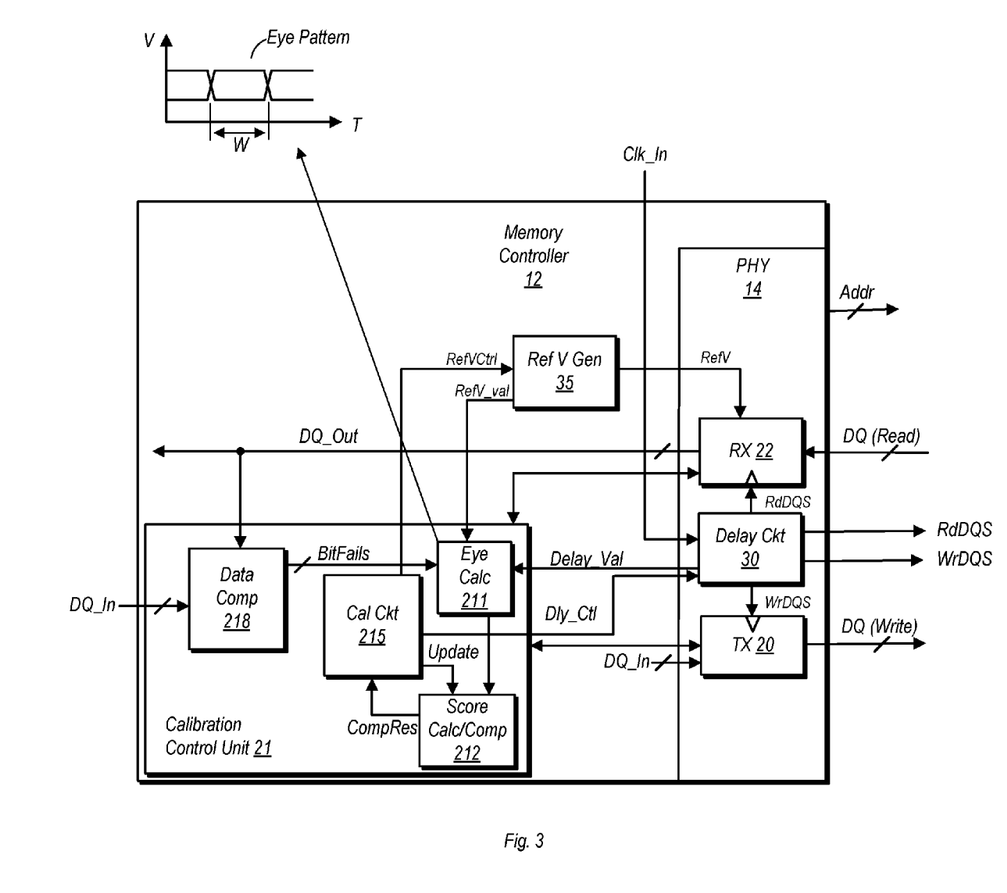
FIG. 3 is a block diagram illustrating one embodiment of a memory controller having a calibration control unit.

FIG. 3 further illustrates one embodiment of a memory controller having a calibration control unit. In the embodiment shown, calibration control unit includes a calibration circuit 215, and eye calculation circuit 211, a score calculation and comparison (SCC) circuit 212, and a data comparison circuit 218.

During calibration operations, the data comparison circuit 218 may receive data that is to be written to the memory via the DQ_In input. Data that is read from memory may be received by data comparison circuit 218 from receiver 22, via the DQ_Out path. The data read from memory may then be compared to data that was written to determine if any bit fails (i.e. bits in particular positions in which the read data and write data do not match in logical value). Bit fails, if any may be reported to eye calculation circuit 211. Responsive to receiving information of a bit fail, eye calculation circuit 211 may record the failing bit along with the reference voltage value and the delay value (as applied to the data strobe). Based on the data from failing bits and corresponding reference voltage and delay values, eye calculation circuit 211 may calculate an eye opening for each bit position. The eye opening data may then be forwarded to SCC circuit 212.

During calibrations in which both the data strobe delay and the reference voltage are calibrated, SCC 212 may calculate and update the reference score. The reference score may be determined based on the width of an eye opening using one of a number of different methodologies. In one embodiment, an average width of the eye opening for all bits may be computed and used as the reference score. In another embodiment, an eye opening having the lowest width for all bits may provide the basis for the reference score. In yet another embodiment, an eye opening for a selected bit (e.g., designated as a worst-case bit) may serve as the basis for the reference score.

During subsequent calibrations, the data strobe delay may be calibrated first, using the most recently calibrated value of the reference voltage. Based on the calibrated delay and the most recently calibrated reference voltage value, eye calculation circuit may calculate eye openings and forward the data to SCC circuit 212. A score may then be calculated and compared to the reference score. The result of the comparison may then be forwarded to calibration circuit 215. If the results of the comparison indicate that the score is within the specified range of the reference score, calibration circuit may inhibit performance of the reference voltage calculation. If the score is outside of the specified range, then calibration circuit 215 may cause the reference voltage to be calibrated. Responsive to determining that the score is not within the specified range of the reference score, calibration circuit 215 may also provide an update indication to SCC circuit 212. Thereafter, SCC circuit 212 may use the eye opening data determined from the reference voltage calibration to update the reference score.

It is noted that while the functions performed by calibration control unit 21 have been described as having been carried out by circuitry, embodiments are possible and contemplated in which at least some of the functions are carried out by software and/or firmware.

Figure 4:
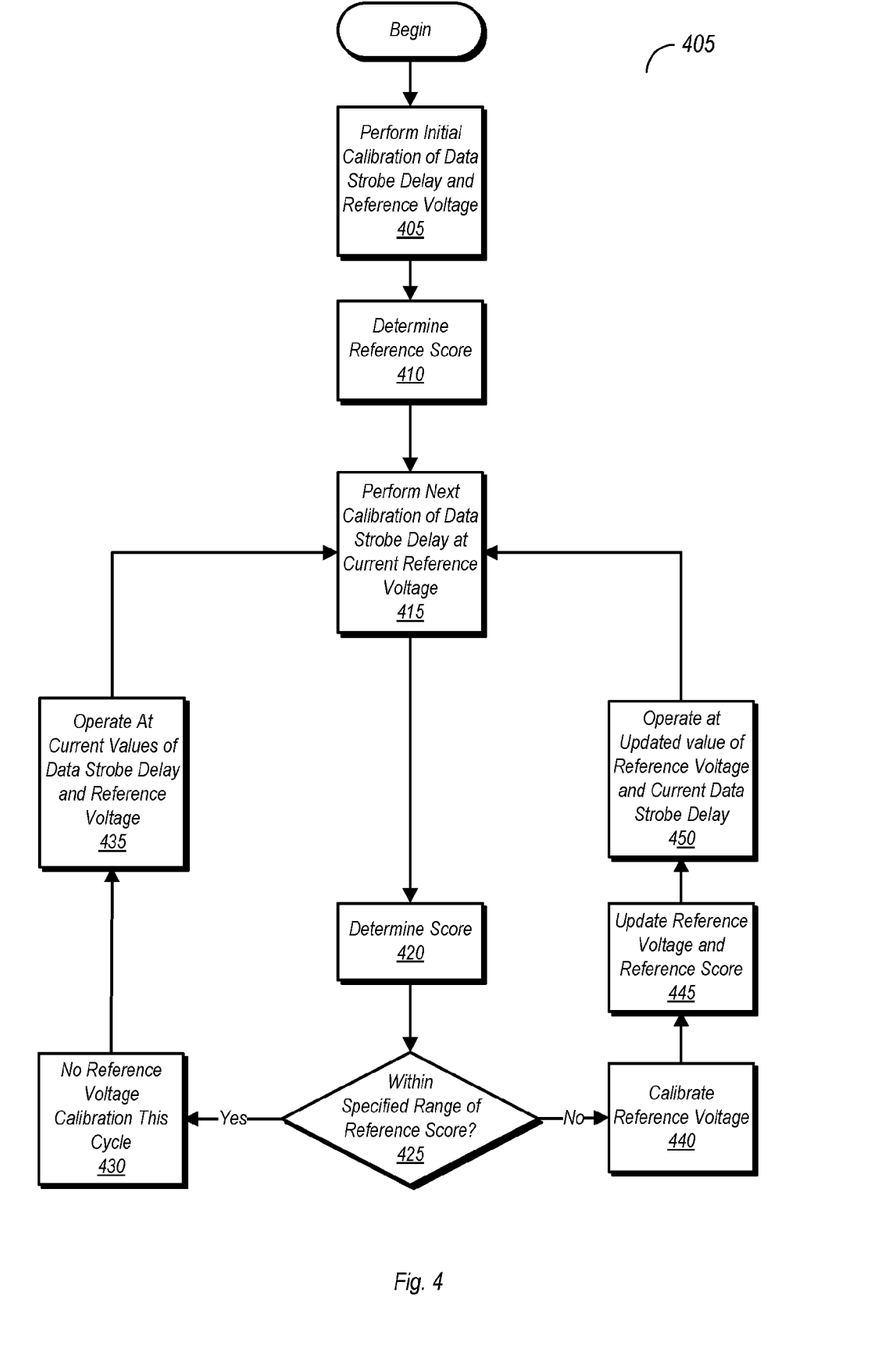
FIG. 4 is a flow diagram illustrating one embodiment for performing periodic calibrations of a memory subsystem.

FIG. 4 if a flow diagram illustrating one embodiment of a method for calibrating a memory subsystem. Method 400 may be implemented using various embodiments of the apparatus discussed above and shown in FIGS. 1-3. Furthermore, apparatus embodiments not explicitly discussed herein that are capable of performing method 400 are also possible and contemplated. The data strobe discussed in the context of FIG. 4 may be a read data strobe (e.g., RdDQS of FIGS. 2 and 3) or a write data strobe (e.g., WrDQS of FIGS. 2 and 3).

Method 400 begins with the performing of an initial calibration, which includes calibrating a data strobe delay and a reference voltage (block 405). Based on the calibrated values of the data strobe delay and reference voltage, eye openings are determined and a reference score is calculated (block 410). The reference score is based on eye openings for one or more bit positions of the data that is written to and read from memory during performance of the calibration.

Each calibration of the data strobe includes performing multiple reads and writes at different delay values. Each calibration of the reference voltage include performing multiple reads and writes at different reference voltage values, and may further be characterized as performing a number of horizontal calibrations at different reference voltage values.

The reference score may be based on an eye opening for at least one bit, and in some cases for multiple bits. For example, reference score may be determined from an average width of an eye opening for all bits. Alternatively, the reference score may be determined from an eye opening with the smallest width. Other methodologies for determining the reference score are also possible and contemplated. In general, any suitable method of determining the reference score may be used with method 400.

After performance of the initial calibration, a next calibration is performed at one of the periodic intervals (block 415). In the next calibration, the data strobe delay is calculated, while using the most recent previously calibrated value of the reference voltage. Based on the previous reference voltage and the data strobe delay calibrated in the current cycle, a score is determined (block 420). The score may be determined on the same basis as that upon which the reference score was determined. Thereafter, the score for the current calibration iteration is compared to the reference score. If the score is within a specified range of the reference score (block 425, yes), then no reference voltage calibration is performed for the current calibration iteration (block 430). Operation up to the next calibration interval may then continue at the current data strobe delay and reference voltage values from their most recent calibrations (block 435). That is, the calibrated delay value obtained in the horizontal calibration performed on the current interval, along with the reference voltage from a most recent previous instance of the vertical are used per block 435. The method then returns to block 415 at the next calibration interval.

If the score for the current iteration is not within the specified range (block 425, no), then the reference voltage is calibrated during the current iteration (block 440). Following calibration of the reference voltage, eye openings are again determined and a new score is determined. The reference score is then updated to be the score determined based on the data strobe delay and reference voltage values resulting from the current calibration iteration (block 445). Thereafter, operation continues with the updated value of the reference voltage and current value of the data strobe delay (block 450). The method then returns to block 415 at the next calibration interval.

Figure 5:
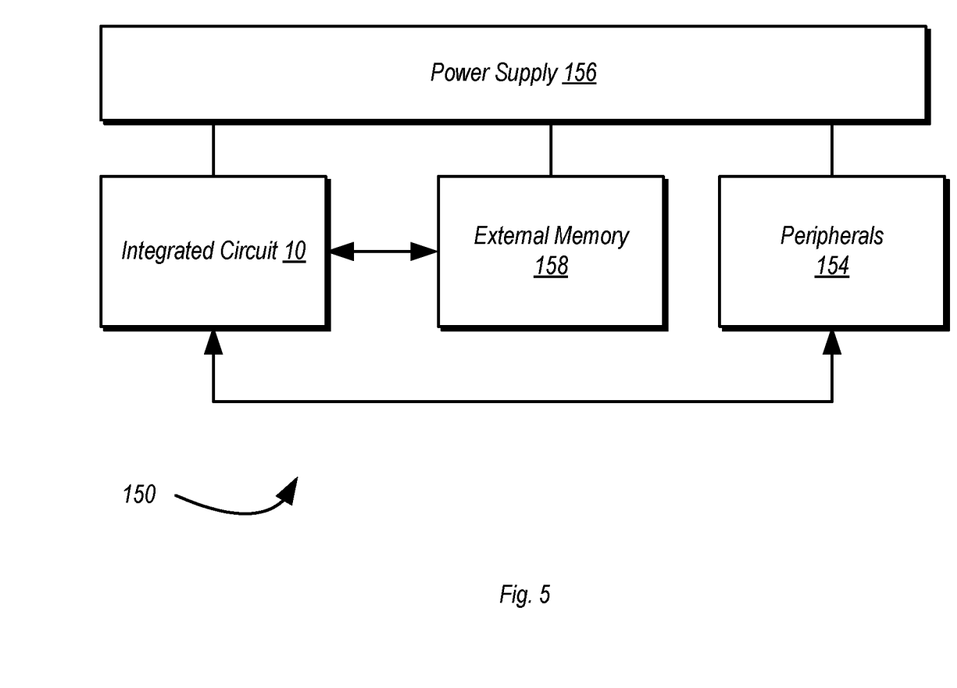
FIG. 5 is a block diagram of one embodiment of a system.

Turning next to FIG. 5, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A method comprising:
   performing, in a memory subsystem including a memory controller and a memory, a first data strobe delay calibration and a first reference voltage calibration to determine first calibrated values for a data strobe delay and a reference voltage, respectively;
   determining a reference score based on the first calibrated values of the data strobe delay and the reference voltage; and
   performing a second calibration, comprising:
      performing a second data strobe delay calibration, where the second data strobe delay calibration is performed based on the first reference voltage;
      determining a score based on the first reference voltage and results of the second data strobe delay calibration; and
      inhibiting performance of a second reference voltage calibration if the score is within a specified range of the reference score.

2. The method as recited in claim 1, further comprising performing the second reference voltage calibration if the score is not within the specified range of the reference score.

3. The method as recited in claim 2, further comprising updating the reference score based on results of performing the second reference voltage calibration.

4. The method as recited in claim 1, wherein performing the first and second data strobe delay calibrations comprises calibrating a delay applied to a data strobe signal conveyed from the memory controller to the memory.

5. The method as recited in claim 1, wherein performing the first and second reference voltage calibrations comprises calibrating a reference voltage used to distinguish whether a bit read from memory is a logic 1 or a logic 0.

6. The method as recited in claim 1, wherein the score and the reference score are based on a width of an eye opening for one or more bits read from the memory.

7. The method as recited in claim 1, wherein performing the first and second data strobe calibrations and first and second reference voltage calibrations includes performing multiple writes of data to memory and reads of data from memory.

8. The method as recited in claim 6, wherein performing multiple reads of data from memory includes:
   reading data from memory for each of a number of different values of a data strobe delay;
   reading data from memory for each of a number of different values of a reference voltage; and
   determining optimal values for the data strobe delay and the reference voltage.

9. An apparatus comprising:
   a memory;
   a memory controller coupled to convey a data strobe to the memory and further configured to write data to and read data from the memory, wherein the memory controller includes a calibration control unit configured to:
      perform first calibrations of a reference voltage and a data strobe delay;
      determine a reference score based on first calibrated values of the data strobe and the reference voltage;
      perform a second data strobe calibration at the first calibrated value of the reference voltage;
      determine a score based on results of the second data strobe calibration and the first reference voltage; and
      inhibit performance of a second reference voltage calibration if the score is within a specified range of the reference score.

10. The apparatus as recited in claim 9, wherein the calibration control unit is configured to perform the second reference voltage calibration if the score is not within the specified range of the reference score.

11. The apparatus as recited in claim 10, wherein the calibration control unit is configured to update the reference score base on results of performing the second reference voltage calibration.

12. The apparatus as recited in claim 9, wherein the calibration control unit is configured to, during performance of the first and second data strobe calibrations, calibrate an amount of delay applied to the data strobe.

13. The apparatus as recited in claim 9, wherein the calibration control unit is configured to, during performance of the first and second reference voltage calibrations, calibrate a reference voltage used to distinguish between a logic 1 and a logic 0.

14. The apparatus as recited in claim 9, wherein the calibration control unit is configured to determine the score and the reference score based on a width of a eye opening for one or more bits read from memory.

15. The apparatus as recited in claim 9, wherein, during performance of the first and second calibrations, the memory controller is configured to perform multiple writes of data to and reads of data from memory.

16. The apparatus as recited in claim 15, wherein, during the first and second calibrations, the calibration control unit is configured to:
   cause the memory controller to read data from memory for each of a number of different values of a data strobe delay;
   cause the memory controller to read data from memory for each of a number of different values of a reference voltage; and
   determine optimal values for the data strobe delay and the reference voltage based on results from reading data from the memory at each of the number of different values of the data strobe delay and the number of different value of the reference voltage.

17. A method comprising:

periodically performing calibrations of a memory subsystem having a memory controller and a memory, wherein the calibrations include a calibration of a data strobe and a calibration of a reference voltage, and wherein performing calibrations includes, during a first calibration of each of the data strobe and the reference voltage, determining a reference score based on a width of a eye opening for one or more bits conveyed between the memory controller and the memory; and for each periodic calibration subsequent to the first calibration:
performing a next calibration of the data strobe;
determining a next score based on results of the next calibration of the data strobe and a most recently calibrated value of the reference voltage; and
performing a next calibration of the reference voltage if the score is not within a specified range of the reference score.

18. The method as recited in claim 17, further comprising inhibiting the next calibration of the reference voltage if the score is within the specified range of the reference score.

19. The method as recited in claim 17, further comprising updating the reference score responsive to performing the next calibration of the reference voltage.

20. The method as recited in claim 17, wherein calibrating the data strobe comprises calibrating a delay applied to the data strobe transmitted from the memory controller to the memory.

\* \* \* \* \*